United States Patent
Cho et al.

(10) Patent No.: US 8,027,183 B2
(45) Date of Patent: Sep. 27, 2011

(54) 3-PHASE INVERTER MODULE, MOTOR DRIVING APPARATUS USING THE SAME, AND INVERTER INTEGRATED CIRCUIT PACKAGE

(75) Inventors: Byoung-Chul Cho, Bucheon (KR); Bum-Seok Suh, Bucheon (KR); Dong-Keun Jang, Bucheon (KR)

(73) Assignee: Fairchild Korea Semiconductor, Ltd., Bucheon-Si (KR)

( * ) Notice: Subject to any disclaimer, the term of this patent is extended or adjusted under 35 U.S.C. 154(b) by 458 days.

(21) Appl. No.: 11/805,631

(22) Filed: May 24, 2007

(65) Prior Publication Data
US 2008/0002445 A1 Jan. 3, 2008

(30) Foreign Application Priority Data

May 24, 2006 (KR) .......................... 10-2006-0046810

(51) Int. Cl.
*H02M 7/537* (2006.01)
(52) U.S. Cl. ........................... 363/131; 363/98; 363/132
(58) Field of Classification Search .................. 363/16, 363/27, 29, 36, 37, 55, 56.01, 71, 95, 98, 363/120, 131, 132
See application file for complete search history.

(56) References Cited

U.S. PATENT DOCUMENTS

| 5,253,156 | A | * | 10/1993 | Sakurai et al. | 363/98 |
| 5,412,558 | A | * | 5/1995 | Sakurai et al. | 363/98 |
| 5,896,286 | A | * | 4/1999 | Terasawa | 363/132 |
| 6,137,705 | A | * | 10/2000 | Maekawa et al. | 363/132 |
| 6,556,458 | B2 | * | 4/2003 | Ohmura et al. | 363/37 |
| 2001/0036097 | A1 | * | 11/2001 | Kikuchi et al. | 363/131 |

FOREIGN PATENT DOCUMENTS

JP 2003-197862 7/2003

* cited by examiner

*Primary Examiner* — Adolf Berhane
*Assistant Examiner* — Nguyen Tran
(74) *Attorney, Agent, or Firm* — Sidley Austin LLP (57) ABSTRACT

A 3-phase inverter module is provided, which includes first and second U-phase switching elements connected in series to each other to constitute a U-phase inverter, first and second V-phase switching elements connected in series to each other to constitute a V-phase inverter, first and second W-phase switching elements connected in series to each other to constitute a W-phase inverter, a U-phase high voltage integrated circuit for generating a control signal for controlling the U-phase inverter according to a U-phase input signal, which has a fault-out terminal for the U-phase, a V-phase high voltage integrated circuit for generating a control signal for controlling the V-phase inverter according to a V-phase input signal, which has a fault-out terminal for the V-phase, and a W-phase high voltage integrated circuit for generating a control signal for controlling the W-phase inverter according to a W-phase input signal, which has a fault-out terminal for the W-phase.

5 Claims, 6 Drawing Sheets

FIG.6

3-PHASE INVERTER MODULE, MOTOR DRIVING APPARATUS USING THE SAME, AND INVERTER INTEGRATED CIRCUIT PACKAGE

CROSS-REFERENCE TO RELATED APPLICATION

This application claims priority to and the benefit of Korean Patent Application No. 10-2006-0046810 filed in the Korean Intellectual Property Office on May 24, 2006, the entire content of which is incorporated herein by reference.

BACKGROUND

The present invention relates to a 3-phase inverter module, and more particularly, to a 3-phase inverter module which can perform 3-phase fault-out detection and 3-phase current detection, a motor driving apparatus using the same, and an inverter integrated circuit package.

An inverter module can be used for various purposes. One example is an inverter module for driving a motor. The inverter module for driving a motor (particularly, a 3-phase inverter module for driving a 3-phase motor) generally includes a plurality of switching elements and a High Voltage Integrated Circuit (HVIC) for controlling the switching elements. One or a plurality of integrated circuits may be used as the high voltage integrated circuit.

If a single high voltage integrated circuit is used, a plurality of switching elements must be controlled using the single high voltage integrated circuit. This requires long wirings, which may cause noise and increase signal delay. This also has limitations in that output currents are detected only for two phases.

To address these problems, in some systems two high voltage integrated circuits may be used. Specifically, the first high voltage integrated circuit can control one set of switching elements of the first, second, and third phases and the second high voltage integrated circuit can control another set of switching elements of the first, second, and third phases. However, this arrangement may also cause noise and increase signal delay due to an increase in the number or length of wirings. Further, in these systems Electromagnetic Interference (EMI) can be present due to the time gradient dv/dt of the voltage v, thereby degrading the performance of components of the inverter module and increasing the dead time.

In other systems, three high voltage integrated circuits may be used to control the switching elements that constitute 3-phase inverters. However, in this case, Insulated Gate Bipolar Transistors (IGBTs) are used as the switching elements, thereby limiting the rating and reducing the efficiency of the inverter module. This also has limitations in that it is not possible to cope with faults occurring in the module.

SUMMARY

Briefly and generally, embodiments of the present invention include a 3-phase inverter module that can adequately protect its components when a fault has occurred in each phase.

Embodiments also provide a motor driving apparatus using the above 3-phase inverter module.

Embodiments also provide an inverter integrated circuit package for the above 3-phase inverter module.

In some embodiments a 3-phase inverter module comprises first and second U-phase switching elements connected in series to each other to constitute a U-phase inverter; first and second V-phase switching elements connected in series to each other to constitute a V-phase inverter; first and second W-phase switching elements connected in series to each other to constitute a W-phase inverter; a U-phase high voltage integrated circuit for generating a control signal for controlling the U-phase inverter according to a received U-phase input signal, the U-phase high voltage integrated circuit having a fault-out terminal for the U-phase; a V-phase high voltage integrated circuit for generating a control signal for controlling the V-phase inverter according to a received V-phase input signal, the V-phase high voltage integrated circuit having a fault-out terminal for the V-phase; and a W-phase high voltage integrated circuit for generating a control signal for controlling the W-phase inverter according to a received W-phase input signal, the W-phase high voltage integrated circuit having a fault-out terminal for the W-phase.

In some embodiments, the first and second U-phase switching elements, the first and second V-phase switching elements, and the first and second W-phase switching elements can be an n-type MOS transistor.

In some embodiments, the U-phase high voltage integrated circuit includes a high-voltage-side floating return voltage terminal connected to a node between the first and second U-phase switching elements.

In some embodiments, the V-phase high voltage integrated circuit includes a high-voltage-side floating return voltage terminal connected to a node between the first and second V-phase switching elements.

In some embodiments, the W-phase high voltage integrated circuit includes a high-voltage-side floating return voltage terminal connected to a node between the first and second W-phase switching elements.

In some embodiments, there is provided a motor driving apparatus for driving a 3-phase motor of U, V, and W phases, the apparatus comprising a 3-phase inverter module for providing U, V, and W-phase output signals for the 3-phase motor, the 3-phase inverter module including first and second U-phase switching elements connected in series to each other to constitute a U-phase inverter; first and second V-phase switching elements connected in series to each other to constitute a V-phase inverter; first and second W-phase switching elements connected in series to each other to constitute a W-phase inverter; a U-phase high voltage integrated circuit for generating a control signal for controlling the U-phase inverter according to a received U-phase input signal, the U-phase high voltage integrated circuit having a fault-out terminal for the U-phase; a V-phase high voltage integrated circuit for generating a control signal for controlling the V-phase inverter according to a received V-phase input signal, the V-phase high voltage integrated circuit having a fault-out terminal for the V-phase; and a W-phase high voltage integrated circuit for generating a control signal for controlling the W-phase inverter according to a received W-phase input signal, the W-phase high voltage integrated circuit having a fault-out terminal for the W-phase.

In some embodiments, the first and second U-phase switching elements, the first and second V-phase switching elements, and the first and second W-phase switching elements is an n-type MOS transistor.

In some embodiments, the U-phase high voltage integrated circuit includes a high-voltage-side floating return voltage terminal connected to a node between the first and second U-phase switching elements.

In some embodiments, the V-phase high voltage integrated circuit includes a high-voltage-side floating return voltage terminal connected to a node between the first and second V-phase switching elements.

In some embodiments, the W-phase high voltage integrated circuit includes a high-voltage-side floating return voltage terminal connected to a node between the first and second W-phase switching elements.

In some embodiments, the motor driving apparatus further comprises a voltage detector connected to a U-phase current detection terminal of the U-phase inverter, a V-phase current detection terminal of the V-phase inverter, and a W-phase current detection terminal of the W-phase inverter; and a comparator for comparing a detection voltage detected by the voltage detector with a reference voltage and generating and inputting an output signal to the fault-out terminals of the U-phase high voltage integrated circuit, the V-phase high voltage integrated circuit, and the W-phase high voltage integrated circuit.

In some embodiments, the comparator includes an op amp that receives an output of the voltage detector through an inverting terminal and receives the reference voltage through a non-inverting terminal.

In some embodiments, there is provided an inverter integrated circuit package comprising a lead frame including first and second chip pad portions; first and second U-phase switching elements, first and second V-phase switching elements, and first and second W-phase switching elements mounted on the first chip pad portion of the lead frame to constitute a U-phase inverter, a V-phase inverter, and a W-phase inverter, respectively; a U-phase high voltage integrated circuit, a V-phase high voltage integrated circuit, and a W-phase high voltage integrated circuit mounted on the second chip pad portion of the lead frame to generate a control signal of the U-phase inverter, a control signal of the V-phase inverter, and a control signal of the W-phase inverter, each of the U-phase, V-phase, and W-phase high voltage integrated circuits including a fault-out terminal; a plurality of first inner leads electrically connected to input terminals and the fault-out terminals of the U-phase, V-phase, and W-phase high voltage integrated circuits; a plurality of second inner leads electrically connected to input terminals and output terminals of the first and second U-phase switching elements, the first and second V-phase switching elements, and the first and second W-phase switching elements; a plurality of first outer leads connected to the first inner leads; and a plurality of second outer leads connected to the second inner leads.

In some embodiments, the inverter integrated circuit package is of a Surface Mount Device (SMD) type.

In some embodiments, the inverter integrated circuit package is of a Dual in Line Package (DIP) type.

In some embodiments, the inverter integrated circuit package is of a dual DIP type.

BRIEF DESCRIPTION OF THE DRAWINGS

The above and other objects, features and other advantages of the present invention will be more clearly understood from the following detailed description taken in conjunction with the accompanying drawings.

DETAILED DESCRIPTION

Figure 1:
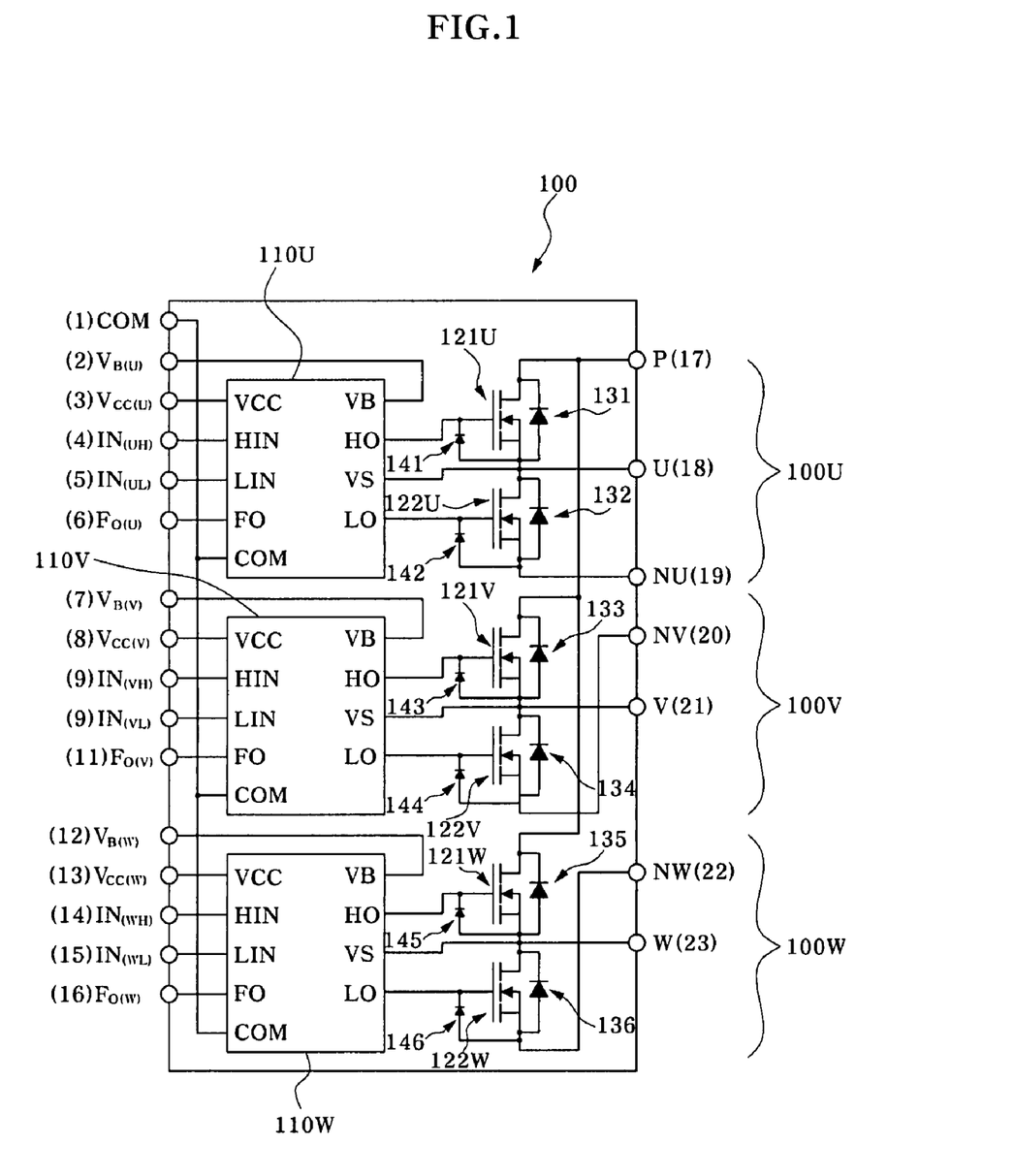
FIG. 1 illustrates a 3-phase inverter module.

FIG. 1 illustrates a 3-phase inverter module 100. The 3-phase inverter module 100 can include a U-phase drive portion 100U for driving the U phase of a 3-phase load such as a 3-phase motor, a V-phase drive portion 100V for driving the V phase, and a W-phase drive portion 100W for driving the W phase. The U-phase drive portion 100U can include a U-phase high voltage integrated circuit 110U, a first U-phase switching element 121U, and a second U-phase switching element 122U. The V-phase drive portion 100V can include a V-phase high voltage integrated circuit 110V, a first V-phase switching element 121V, and a second V-phase switching element 122V. The W-phase drive portion 100W can include a W-phase high voltage integrated circuit 110W, a first W-phase switching element 121W, and a second W-phase switching element 122W. The first and second U-phase switching elements 121U and 122U, the first and second V-phase switching elements 121V and 122V, and the first and second W-phase switching elements 121W and 122W may include a power n-type Metal Oxide Semiconductor Field Effect Transistor (nMOSFET). These switching elements may also include a different power transistor such as an Insulated Gate Bipolar Transistor (IGBT) instead.

The U-phase high voltage integrated circuit 110U can include a supply voltage terminal VCC, input terminals HIN and LIN, a common ground terminal COM, a high-voltage-side floating voltage terminal VB, a high-voltage-side floating return voltage terminal VS, output terminals HO and LO, and a fault-out terminal FO. The supply voltage terminal VCC can be used to input a supply voltage Vcc(u) to the U-phase high voltage integrated circuit 110U. The input terminals HIN and LIN can be used to input U-phase drive input signals IN(UH) and IN(UL) to the U-phase high voltage integrated circuit 110U. The common ground terminal COM can be used to input a common ground signal COM to the U-phase high voltage integrated circuit 110U. The high-voltage-side floating voltage terminal VB can be used to input a high-voltage-side floating voltage VB(U) to the U-phase high voltage integrated circuit 110U. The high-voltage-side floating return voltage terminal VS can be connected to a U-phase output terminal U, which is a contact between the first U-phase switching element 121U and the second U-phase switching element 122U, and can be used to detect a U-phase output current.

The output terminals HO and LO can be used to output a high-voltage-side output signal and a low-voltage-side output signal generated from the U-phase drive input signals IN(UH) and IN(UL) input through the input terminal HIN and LIN. The output signal from the high-voltage-side output terminal HO can be input to a gate terminal of the first U-phase switching element 121U to turn on or off the first U-phase switching element 121U. The output signal from the low-voltage-side output terminal LO can be input to a gate terminal of the second U-phase switching element 122U to turn on or off the second U-phase switching element 122U.

The fault-out terminal FO can be used to output or input a fault-out signal FO(U) from or to the U-phase high voltage integrated circuit 110U. Specifically, when an internal fault is detected, for example when an overcurrent is detected or when a low supply voltage VCC(U) is input, the U-phase high voltage integrated circuit 110U outputs a fault-out signal FO(U) or shuts down the inverter module 100 in order to prevent failure of the components of the inverter module 100. Alternatively, to shut down the inverter module 100 from the outside, a fault-out signal FO(U) may be input to the U-phase high voltage integrated circuit 110U through the fault-out terminal FO.

The V-phase high voltage integrated circuit 110V can also include a supply voltage terminal VCC, input terminals HIN and LIN, a common ground terminal COM, a high-voltageside floating voltage terminal VB, a high-voltage-side floating return voltage terminal VS, output terminals HO and LO, and a fault-out terminal FO. The supply voltage terminal VCC can be used to input a supply voltage Vcc(V) to the V-phase high voltage integrated circuit 110V. The input terminals HIN and LIN can be used to input V-phase drive input signals IN(VH) and IN(VL) to the V-phase high voltage integrated circuit 110V. The common ground terminal COM can be used to input a common ground signal COM to the V-phase high voltage integrated circuit 110V. The high-voltage-side floating voltage terminal VB can be used to input a high-voltage-side floating voltage VB(V) to the V-phase high voltage integrated circuit 110V. The high-voltage-side floating return voltage terminal VS can be connected to a V-phase output terminal V, which is a contact between the first V-phase switching element 121V and the second V-phase switching element 122V, and can be used to detect a V-phase output current.

The output terminals HO and LO can be used to output a high-voltage-side output signal and a low-voltage-side output signal generated from the V-phase drive input signals IN(VH) and IN(VL) input through the input terminals HIN and LIN. The output signal from the high-voltage-side output terminal HO can be input to a gate terminal of the first V-phase switching element 121V to turn on or off the first V-phase switching element 121V. The output signal from the low-voltage-side output terminal LO can be input to a gate terminal of the second V-phase switching element 122V to turn on or off the second V-phase switching element 122V.

The fault-out terminal FO can be used to output or input a fault-out signal FO(V) from or to the V-phase high voltage integrated circuit 110V. Specifically, when an internal fault is detected, for example when an overcurrent is detected or when a low supply voltage VCC(V) is input, the V-phase high voltage integrated circuit 110V outputs a fault-out signal FO(V) or shuts down the inverter module 100 in order to prevent failure of the components of the inverter module 100. Alternatively, to shut down the inverter module 100 from the outside, a fault-out signal FO(V) may be input to the V-phase high voltage integrated circuit 110V through the fault-out terminal FO.

The W-phase high voltage integrated circuit 110W can also include a supply voltage terminal VCC, input terminals HIN and LIN, a common ground terminal COM, a high-voltage-side floating voltage terminal VB, a high-voltage-side floating return voltage terminal VS, output terminals HO and LO, and a fault-out terminal FO. The supply voltage terminal VCC can be used to input a supply voltage Vcc(W) to the W-phase high voltage integrated circuit 110W. The input terminals HIN and LIN can be used to input W-phase drive input signals IN(WH) and IN(WL) to the W-phase high voltage integrated circuit 110W. The common ground terminal COM can be used to input a common ground signal COM to the W-phase high voltage integrated circuit 110W. The high-voltage-side floating voltage terminal VB can be used to input a high-voltage-side floating voltage VB(W) to the W-phase high voltage integrated circuit 110W. The high-voltage-side floating return voltage terminal VS can be connected to a W-phase output terminal W, which can be a contact between the first W-phase switching element 121W and the second W-phase switching element 122W, and can be used to detect a W-phase output current.

The output terminals HO and LO can be used to output a high-voltage-side output signal and a low-voltage-side output signal generated from the W-phase drive input signals IN(WH) and IN(WL) input through the input terminal HIN and LIN. The output signal from the high-voltage-side output terminal HO can be input to a gate terminal of the first W-phase switching element 121W to turn on or off the first W-phase switching element 121W. The output signal from the low-voltage-side output terminal LO can be input to a gate terminal of the second W-phase switching element 122W to turn on or off the second W-phase switching element 122W.

The fault-out terminal FO can be used to output or input a fault-out signal FO(W) from or to the W-phase high voltage integrated circuit 110W. Specifically, when an internal fault is detected, for example when an overcurrent is detected or when a low supply voltage VCC(W) is input, the W-phase high voltage integrated circuit 110W outputs a fault-out signal FO(W) or shuts down the inverter module 100 in order to prevent failure of the components of the inverter module 100. Alternatively, to shut down the inverter module 100 from the outside, a fault-out signal FO(W) may be input to the W-phase high voltage integrated circuit 110W through the fault-out terminal FO.

The first U-phase switching element 121U and the second U-phase switching element 122U can be connected in series to each other such that a source of the first U-phase switching element 121U is connected to a drain of the second U-phase switching element 122U. Specifically, the drain of the first U-phase switching element 121U can be connected to a motor drive power supply terminal P, the gate can be connected to the high-voltage-side output terminal HO of the U-phase high voltage integrated circuit 110U, and the source can be connected to the U-phase output terminal U. The drain of the second U-phase switching element 122U can be connected to the U-phase output terminal U, the gate can be connected to the low-voltage-side output terminal LO of the U-phase high voltage integrated circuit 110U, and the source can be connected to a U-phase current detection terminal NU that is used to detect the current of a U-phase output signal. Diodes 131 and 132 can be connected in parallel to the first and second U-phase switching elements 121U and 122U, respectively. Electrostatic Discharge Diodes (ESD) 141 and 142 can be connected between the source and gate of the first U-phase switching element 121U and between the source and gate of the second U-phase switching element 122U, respectively.

The first V-phase switching element 121V and the second V-phase switching element 122V can be connected in series to each other such that a source of the first V-phase switching element 121V is connected to a drain of the second V-phase switching element 122V. Specifically, the drain of the first V-phase switching element 121V can be connected to the motor drive power supply terminal P, the gate can be connected to the high-voltage-side output terminal HO of the V-phase high voltage integrated circuit 110V, and the source can be connected to the V-phase output terminal V. The drain of the second V-phase switching element 122V can be connected to the V-phase output terminal V, the gate can be connected to the low-voltage-side output terminal LO of the V-phase high voltage integrated circuit 110V, and the source can be connected to a V-phase current detection terminal NV that is used to detect the current of a V-phase output signal. Diodes 133 and 134 can be connected in parallel to the first and second V-phase switching elements 121V and 122V, respectively. Electrostatic Discharge Diodes (ESD) 143 and 144 can be connected between the source and gate of the first V-phase switching element 121V and between the source and gate of the second V-phase switching element 122V, respectively.

The first W-phase switching element 121W and the second W-phase switching element 122W can be connected in series to each other such that a source of the first W-phase switching element 121W is connected to a drain of the second W-phase switching element 122W. Specifically, the drain of the first W-phase switching element 121W can be connected to the motor drive power supply terminal P, the gate can be connected to the high-voltage-side output terminal HO of the W-phase high voltage integrated circuit 110W, and the source can be connected to the W-phase output terminal W. The drain of the second W-phase switching element 122W can be connected to the W-phase output terminal W, the gate can be connected to the low-voltage-side output terminal LO of the W-phase high voltage integrated circuit 110W, and the source can be connected to a W-phase current detection terminal NW that is used to detect the current of a W-phase output signal. Diodes 135 and 136 can be connected in parallel to the first and second W-phase switching elements 121W and 122W, respectively. Electrostatic Discharge Diodes (ESD) 145 and 146 can be connected between the source and gate of the first W-phase switching element 121W and between the source and gate of the second W-phase switching element 122W, respectively.

The 3-phase inverter module 100 can include the U-phase high voltage integrated circuit 110U, the V-phase high voltage integrated circuit 110V, and the W-phase high voltage integrated circuit 110W that have their respective fault-out terminals FO, through which it is possible to output or input a fault-out signal FO(U) in the U-phase drive portion 100U, a fault-out signal FO(V) in the V-phase drive portion 100V, and a fault-out signal FO(W) in the W-phase drive portion 100W. In addition, it is possible to detect a U-phase current of the 3-phase motor by connecting the U-phase output terminal U to the high-voltage-side floating return voltage terminal VS of the U-phase high voltage integrated circuit 110U, it is possible to detect a V-phase current of the 3-phase motor by connecting the V-phase output terminal V to the high-voltage-side floating return voltage terminal VS of the V-phase high voltage integrated circuit 110V, and it is possible to detect a W-phase current of the 3-phase motor by connecting the W-phase output terminal W to the high-voltage-side floating return voltage terminal VS of the W-phase high voltage integrated circuit 110W. Further, it is possible to increase the stability of the module by integrating the electrostatic discharge diodes 141 to 146 together.

Figure 2:
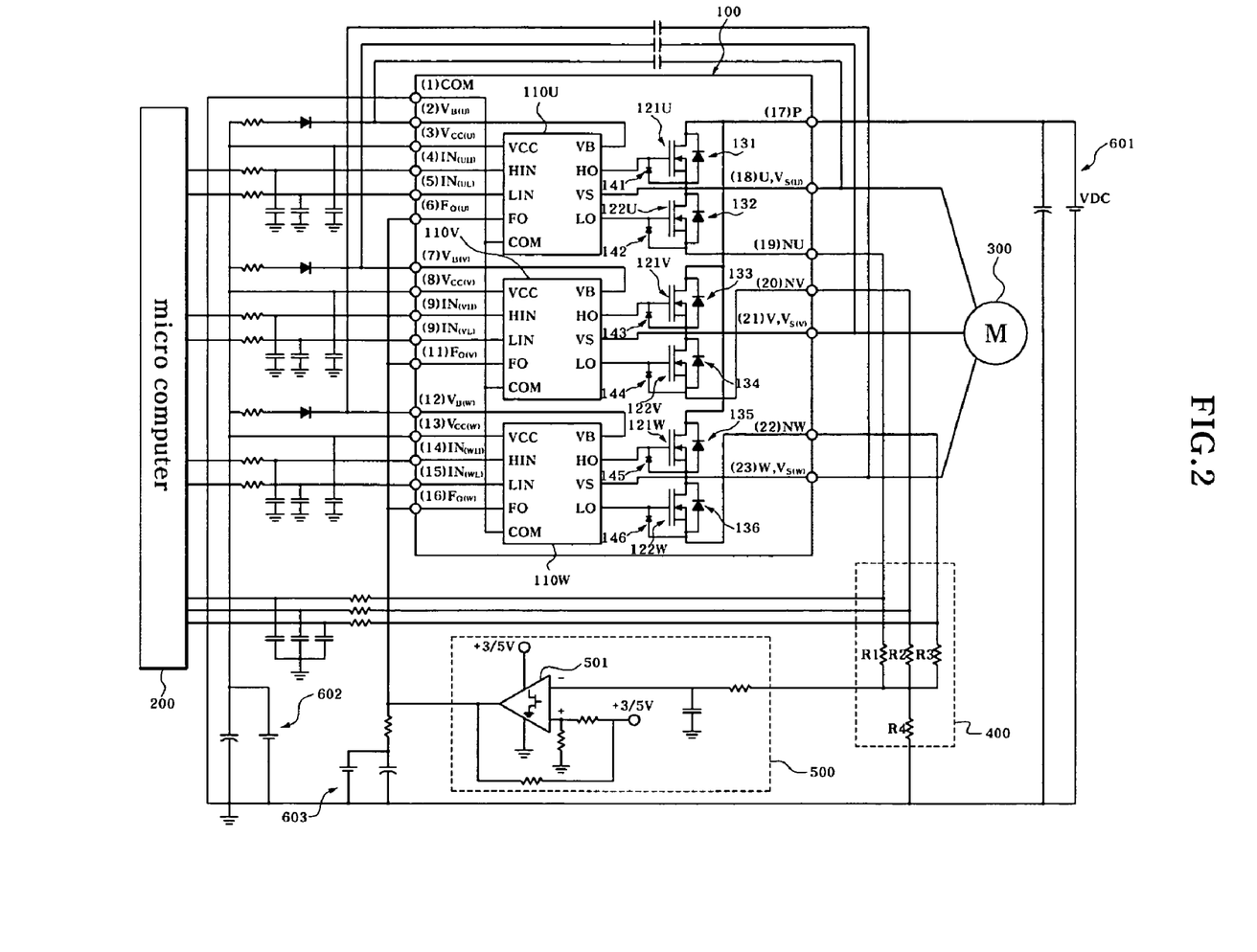
FIG. 2 illustrates a motor driving apparatus using the 3-phase inverter module of FIG. 1.

FIG. 2 illustrates a motor driving apparatus using the 3-phase inverter module of FIG. 1. In FIG. 2, the same elements as those of FIG. 1 are denoted by the same reference numerals as those of FIG. 1.

The motor driving apparatus can include a 3-phase inverter module 100 for controlling a 3-phase motor (M) 300, a microcomputer 200 for performing overall control of the motor driving apparatus, a voltage detector 400 for detecting a voltage corresponding to an output current of the 3-phase inverter module 100, a comparator 500 for comparing a voltage signal detected by the voltage detector 400 with a reference voltage signal, and power supplies 601, 602, and 603.

The 3-phase inverter module 100 is the same as described above with reference to FIG. 1, thus its description is not repeated here. A U-phase output signal VS(U), a V-phase output signal VS(V), and a W-phase output signal VS(W) generated at the U-phase output terminal U, the V-phase output terminal V, and the W-phase output terminal W of the 3-phase inverter module 100 can be input to the 3-phase motor (M) 300 to drive the 3-phase motor 300.

The voltage detector 400 can be connected to the current detection terminals NU, NV, and NW of the 3-phase inverter module 100. The voltage detector 400 can include resistors R1, R2, and R3, which can be connected respectively to the 3-phase current detection terminals NU, NV, and NW of the 3-phase inverter module 100. A resistor R4 can be connected in series to the resistors R1, R2, and R3. For the U phase, the voltage detector 400 can detect a voltage that is applied across the resistor R4 due to an output current of the U-phase current detection terminal NU of the 3-phase inverter module 100, which flows to the resistor R4 through the resistor R1, and inputs the detected voltage to the comparator 500. For the V phase, the voltage detector 400 can detect a voltage that is applied across the resistor R4 due to an output current of the V-phase current detection terminal NV of the 3-phase inverter module 100, which flows to the resistor R4 through the resistor R2, and inputs the detected voltage to the comparator 500. For the W phase, the voltage detector 400 can detect a voltage that is applied across the resistor R4 due to an output current of the W-phase current detection terminal NW of the 3-phase inverter module 100, which flows to the resistor R4 through the resistor R3, and inputs the detected voltage to the comparator 500.

The comparator 500 can compare a voltage input from the voltage detector 400 with a reference voltage and generate an output signal according to the comparison. Specifically, the comparator 500 can receive a voltage signal input from the voltage detector 400 through an inverting terminal of an op amp 501, and receive a reference voltage signal through a non-inverting terminal of the op amp 501. The comparator 500 then compares the two voltage signals and generates an output signal if the voltage signal input from the voltage detector 400 is greater than the reference voltage signal. The output signal of the comparator 500 can be input to the fault-out terminal FO(U) of the U-phase high voltage integrated circuit 110U, the fault-out terminal FO(V) of the V-phase high voltage integrated circuit 110V, and the fault-out terminal FO(W) of the W-phase high voltage integrated circuit 110W in the 3-phase inverter module 100. If a fault occurs in any of the U, V, and W phases to cause the output signal of the comparator 500 to be input to the fault-out terminals of the 3-phase inverter module 100, it is determined that a fault has occurred and thus the 3-phase inverter module 100 is shut down.

The power supply 601 can supply a power supply voltage VDC to drive the motor 300. The power supply voltage VDC from the power source 601 can be supplied through the motor drive power supply terminal P of the 3-phase inverter module 100. The power supply 602 can supply a power supply voltage required to drive the U-phase high voltage integrated circuit 110U, the V-phase high voltage integrated circuit 110V, and the W-phase high voltage integrated circuit 110W in the 3-phase inverter module 100. The power supply 603 can supply a bias voltage for the op amp 501 in the comparator 500.

Figure 3:
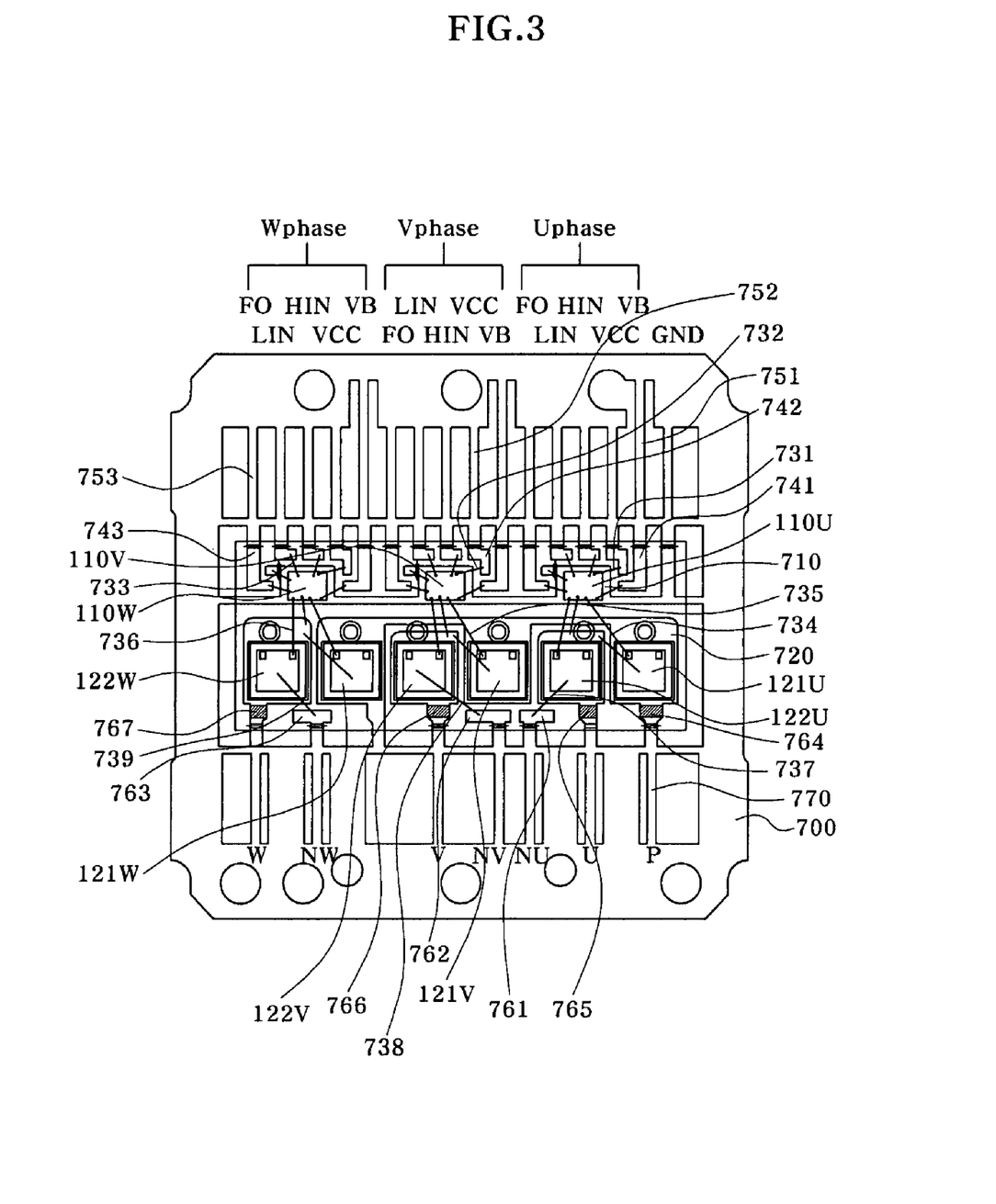
FIG. 3 is a plan view of an inverter integrated circuit package.

FIG. 3 is a plan view of an inverter integrated circuit package. In this embodiment an upper chip pad portion 710 and a lower chip pad portion 720 can be disposed in the middle of a lead frame 700. A U-phase high voltage integrated circuit 110U, a V-phase high voltage integrated circuit 110V, and a W-phase high voltage integrated circuit 110W can be mounted on the upper chip pad portion 710. Terminals GND, VB, VCC, HIN, LIN, and FO of the U-phase high voltage integrated circuit 100U can be connected to first upper inner leads 741 through a first wire 731. The first upper inner leads 741 can be connected to first upper outer leads 751. In addition, terminals GND, VB, VCC, HIN, LIN, and FO of the V-phase high voltage integrated circuit 100V can be connected to second upper inner leads 742 through a second wire 732. The second upper inner leads 742 can be connected to second upper outer leads 752. Similarly, terminals GND, VB, VCC, HIN, LIN, and FO of the W-phase high voltage integrated circuit 100W can be connected to third upper inner leads 743 through a third wire 733. The third upper inner leads 743 can be connected to third upper outer leads 753. One of the first to third upper outer leads 751, 752, and 753, connected to the high-voltage-side floating voltage terminals VB, can be longer than the other outer leads for insulation between neighboring high-voltage and low-voltage terminals.

First and second U-phase switching elements 121U and 122U, which constitute a U-phase drive portion (100U in FIG. 1), first and second V-phase switching elements 121V and 122V, which constitute a V-phase drive portion (100V in FIG. 1), and first and second W-phase switching elements 121W and 122W, which constitute a W-phase drive portion (100W in FIG. 1) can be mounted on the lower chip pad portion 720 of the lead frame 700. A gate pad of the first U-phase switching element 121U and a gate pad of the second U-phase switching element 122U can be connected to the U-phase high voltage integrated circuit 110U through a fourth wire 734. In addition, a gate pad of the first V-phase switching element 121V and a gate pad of the second V-phase switching element 122V can be connected to the V-phase high voltage integrated circuit 110V through a fifth wire 735. Similarly, a gate pad of the first W-phase switching element 121W and a gate pad of the second W-phase switching element 122W can be connected to the W-phase high voltage integrated circuit 110W through a six wire 736. The first U-phase switching element 121U and the second U-phase switching element 122U can be connected to each other through a wire for the series connection structure shown in FIG. 1. In addition, the first V-phase switching element 121V and the second V-phase switching element 122V can be connected to each other through a wire and the first W-phase switching element 121W and the second W-phase switching element 122W can be connected to each other through a wire. A U-phase current detection terminal NU, which can be a source terminal of the second U-phase switching element 122U, can be connected to a first lower inner lead 761 through a seventh wire 737, a V-phase current detection terminal NV, which can be a source terminal of the second V-phase switching element 122V, can be connected to a second lower inner lead 762 through an eighth wire 738, and a W-phase current detection terminal NW, which can be a source terminal of the second W-phase switching element 122W, can be connected to a third lower inner lead 763 through a ninth wire 739. A fourth inner lead 764, a fifth inner lead 765, a six inner lead 766, and a seventh inner lead 767 can be formed integrally on the lower chip pad portion 720. The fourth inner lead 764, the fifth inner lead 765, the six inner lead 766, and the seventh inner lead 767 can extend from the lower chip pad portion 720 to be connected respectively to a motor drive power supply terminal P, a U-phase output terminal U, a V-phase output terminal V, and W-phase output terminal W. The first to seventh inner leads 761 to 767 can be connected to respective lower outer leads 770.

Figure 4:
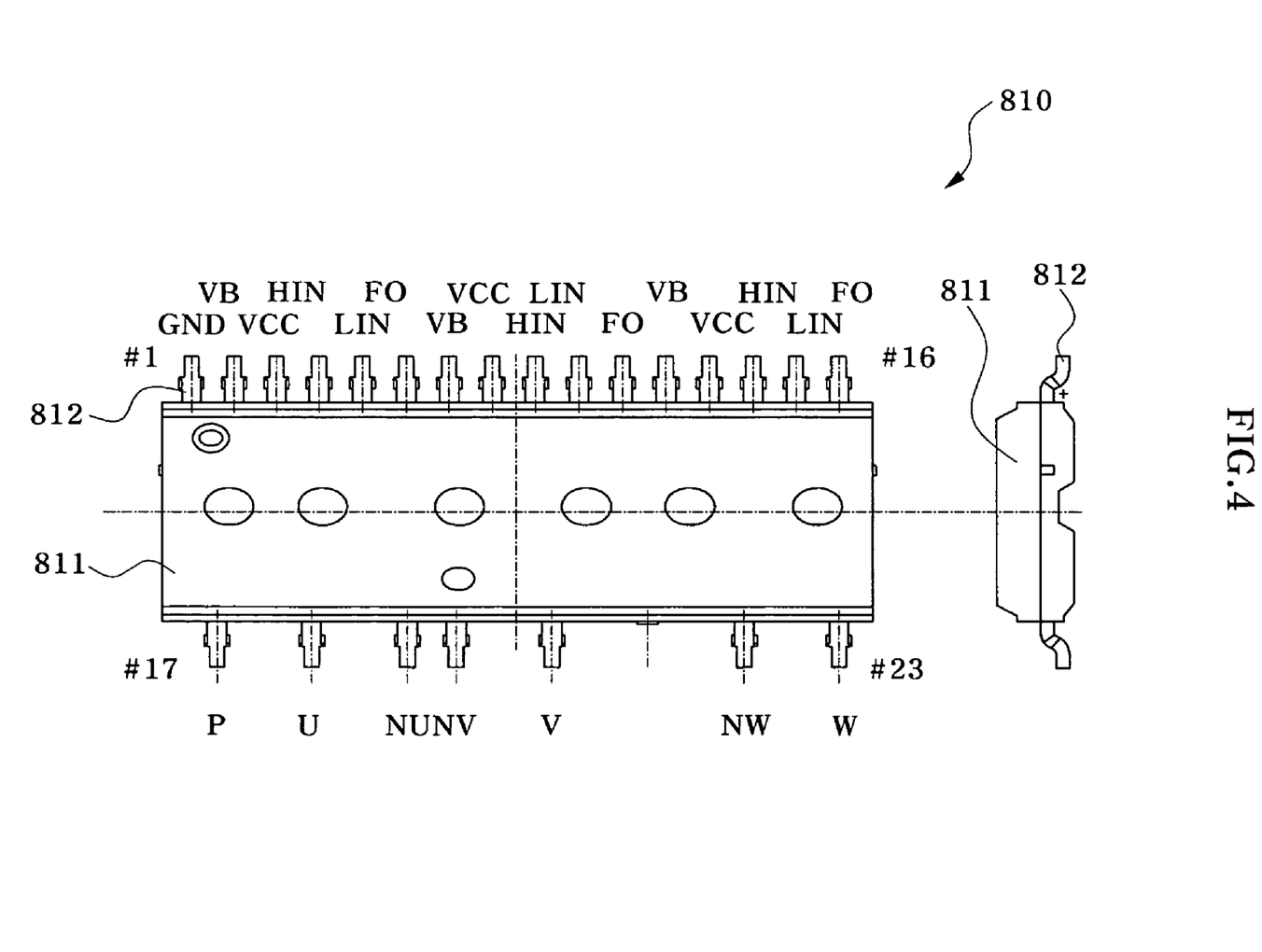
FIGS. 4 to 6 illustrate various embodiments of an inverter integrated circuit packet.
Figure 5:
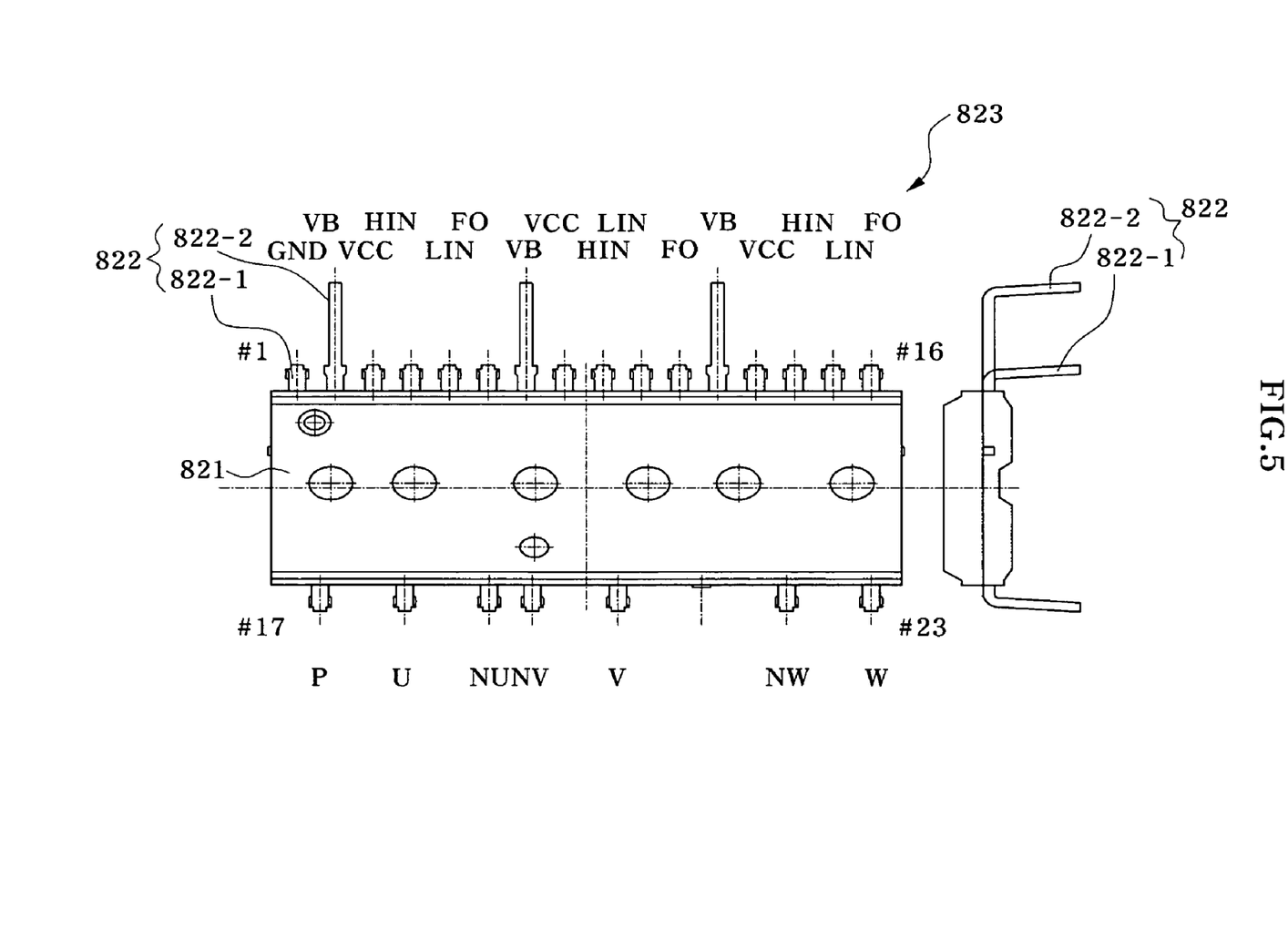
Figure 6:
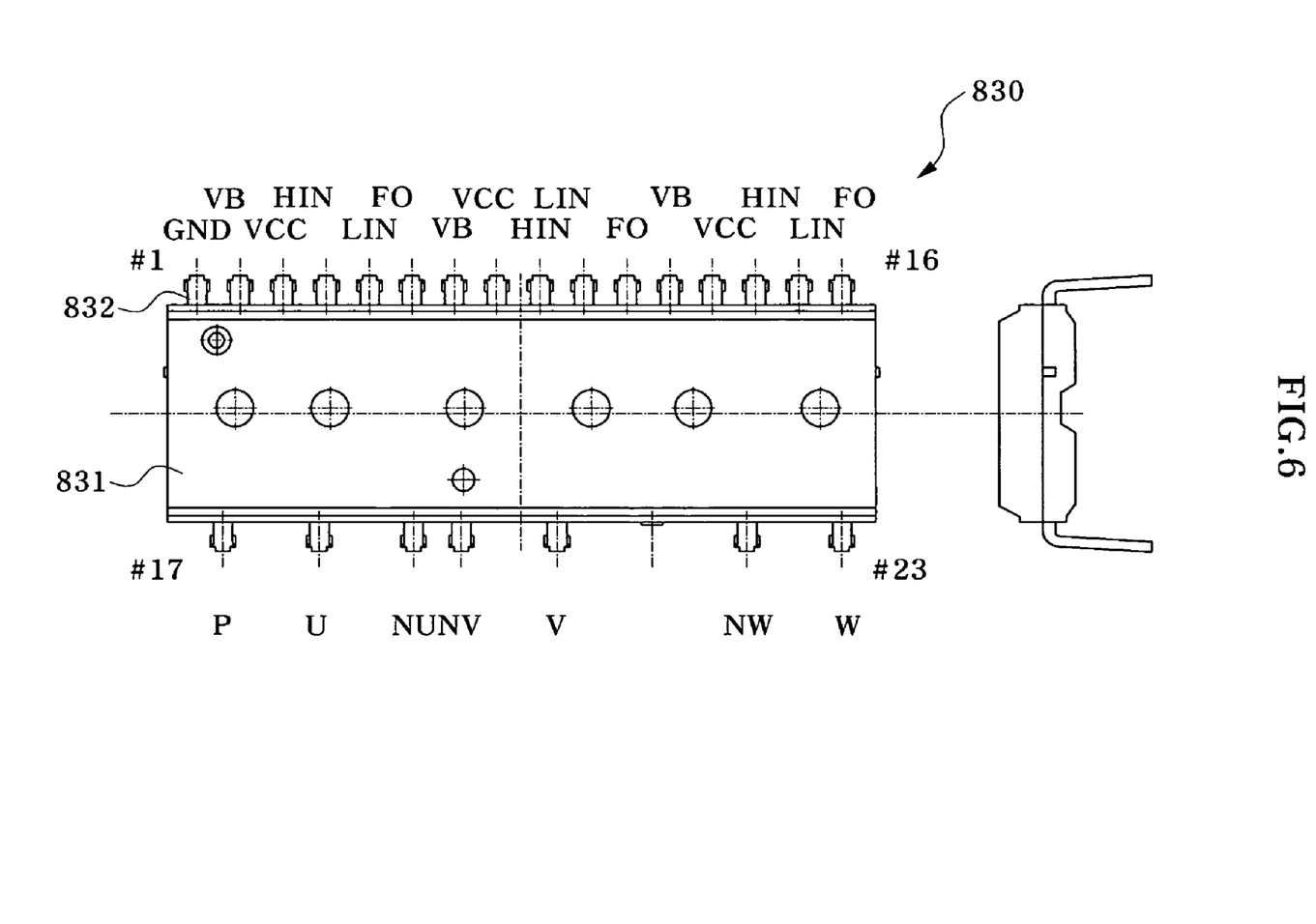

FIGS. 4 to 6 illustrate various embodiments of an inverter integrated circuit packet. A left drawing in each of FIGS. 4 to 6 is a plan view and a right drawing is a side view.

FIG. 4 illustrates an inverter integrated circuit package 810, which can be of a Surface Mount Device (SMD) type, can be molded with an epoxy molding compound 811 and outer leads 812 can be arranged on both sides of the epoxy molding compound 811. An outer lead 812 that can be arranged leftmost on the upper side of the epoxy molding compound 811 in FIG. 4 is a ground (GND) terminal. Next to the GND terminal, a high-voltage-side floating voltage terminal VB, a supply voltage terminal VCC, a high-voltage-side input signal terminal HIN, a low-voltage-side input signal terminal LIN, and a fault-out terminal FO for the U phase; and a high-voltage-side floating voltage terminal VB, a supply voltage terminal VCC, a high-voltage-side input signal terminal HIN, a low-voltage-side input signal terminal LIN, and a fault-out terminal FO for the V phase; and a high-voltage-side floating voltage terminal VB, a supply voltage terminal VCC, a high-voltage-side input signal terminal HIN, a low-voltage-side input signal terminal LIN, and a fault-out terminal FO for the W phase can be sequentially arranged. An outer lead 812 that is arranged leftmost on the lower side of the epoxy molding compound 811 in FIG. 4 can be a motor drive power supply terminal P. Next to outer lead 812 a U-phase output signal terminal U, a U-phase current detection terminal NU, a V-phase current detection terminal NV, a V-phase output signal terminal V, a W-phase current detection terminal NW, and a W-phase output signal terminal W can be sequentially arranged.

FIG. 5 illustrates an inverter integrated circuit package 820. The embodiment of FIG. 5 can be similar to that of the embodiment of FIG. 4 in that it is molded with an epoxy molding compound 821 and outer leads 822 can be arranged on both sides of the epoxy molding compound 821. However, in this embodiment, high-voltage-side floating voltage terminals VB can be constructed of a long outer lead 822-2 that can be separated by a relatively large distance from the epoxy molding compound 821 and the other terminals can be constructed with a short outer lead 822-1. This structure can be of a Dual in Line Package, or DIP, type to provide insulation intervals between neighboring outer leads. The order in which the outer leads 822 are arranged can be the same as that of the previous embodiment.

FIG. 6 illustrates an inverter integrated circuit package 830, which can be similar to that of the previous embodiment of FIG. 4 in that it can be molded with an epoxy molding compound 831 and the outer leads 832 can be arranged on both sides of the epoxy molding compound 831. The embodiment of FIG. 6 can be different from the previous embodiment only in that it employs a DIP architecture.

The present invention provides a 3-phase inverter module which can perform 3-phase fault-out detection and 3-phase current detection, a motor driving apparatus using the same, and an inverter integrated circuit package, which have the following features.

First, embodiments are capable of reliably protecting the system when a 3-phase fault occurs since a fault-out terminal can be provided for each phase.

Second, embodiments are capable of performing 3-phase current detection since an individual current detection terminal can be provided for each phase.

Third, the stability of the system can be increased since a diode for electrostatic discharge protection can be provided for each phase.

Fourth, embodiments are capable of reducing the noise and secure a wider Safe Operation Area (SOA) by using MOSFETs instead of IGBTs as switching elements for the inverter module.

Although embodiments of the present invention have been disclosed for illustrative purposes, persons of ordinary skill in the art will appreciate that various modifications, additions and substitutions are possible, without departing from the scope and spirit of the invention, which is defined solely by the accompanying claims.

What is claimed is:
1. A 3-phase inverter integrated circuit comprising:
first and second U-phase switching elements connected in series to each other to constitute a U-phase inverter, each switching element comprising a control terminal;

first and second V-phase switching elements connected in series to each other to constitute a V-phase inverter, each switching element comprising a control terminal;

first and second W-phase switching elements connected in series to each other to constitute a W-phase inverter, each switching element comprising a control terminal;

a single U-phase high voltage integrated circuit for generating respective control signals applied to the control terminals of and for controlling both the first and second U-phase switching elements of the U-phase inverter according to a received U-phase input signal, the U-phase high voltage integrated circuit having a fault-out terminal for the U-phase;

a single V-phase high voltage integrated circuit for generating respective control signals applied to the control terminals of and for controlling both the first and second V-phase switching elements of the V-phase inverter according to a received V-phase input signal, the V-phase high voltage integrated circuit having a fault-out terminal for the V-phase; and a single W-phase high voltage integrated circuit for generating respective control signals applied to the control terminals of and for controlling both the first and second W-phase switching elements of the W-phase inverter according to a received W-phase input signal, the W-phase high voltage integrated circuit having a fault-out terminal for the W-phase.

2. The 3-phase inverter integrated circuit according to claim 1, wherein at least one of the first and second U-phase switching elements, the first and second V-phase switching elements, and the first and second W-phase switching elements is an n-type MOS transistor.

3. The 3-phase inverter integrated circuit according to claim 2, wherein the U-phase high voltage integrated circuit comprises a high-voltage-side floating return voltage terminal coupled to a node between the first and second U-phase switching elements.

4. The 3-phase inverter integrated circuit according to claim 2, wherein the V-phase high voltage integrated circuit comprises a high-voltage-side floating return voltage terminal connected to a node between the first and second V-phase switching elements.

5. The 3-phase inverter integrated circuit according to claim 2, wherein the W-phase high voltage integrated circuit includes a high-voltage-side floating return voltage terminal connected to a node between the first and second W-phase switching elements.

* * * * *